United States Patent [19]
Milkovic

[11] Patent Number: 4,786,863
[45] Date of Patent: * Nov. 22, 1988

[54] SOLID STATE WATTHOUR METER WITH SWITCHED-CAPACITOR INTEGRATION

[75] Inventor: Miran Milkovic, Schenectady, N.Y.

[73] Assignee: General Electric Co.

[*] Notice: The portion of the term of this patent subsequent to Jul. 21, 2004 has been disclaimed.

[21] Appl. No.: 50,628

[22] Filed: May 15, 1987

Related U.S. Application Data

[63] Continuation of Ser. No. 812,369, Dec. 23, 1985.

[51] Int. Cl.$^4$ .................. G01R 19/06; G01R 19/00
[52] U.S. Cl. ......................................... 324/142; 324/130; 330/9; 364/483
[58] Field of Search ............... 324/107, 111, 130, 142; 330/9; 328/160, 127, 128; 364/841, 842, 483; 307/529

[56] References Cited

U.S. PATENT DOCUMENTS

| | | | |
|---|---|---|---|
| 4,315,212 | 2/1982 | Gamoh | 324/107 |
| 4,535,287 | 8/1985 | Milkovic | 324/142 |
| 4,616,185 | 10/1986 | van Roermund | 328/160 |
| 4,682,102 | 7/1987 | Milkovic | 324/142 |

OTHER PUBLICATIONS

"MOS Sampled Data Recursive Filters Using Switched Capacities Integrators", by Hosticka et al., IEEE Journal of Solid St. Ckts., vol. SC-12, #6, 12/77, pp. 250–258.
Effect of Switch and Routing Related Parasitic Capacitances, M. S. Ghausi, et al., Modern Filter Design, pp. 456–461, Prentice Hall, 1981.

Primary Examiner—Reinhard J. Eisenzopf
Assistant Examiner—W. Burns
Attorney, Agent, or Firm—Thomas R. Morrison

[57] ABSTRACT

A switched-capacitor integrator is employed in an electronic watthour measurement device for integrating the average component of a product signal formed by pulse-width modulating an analog signal proportional to one of a load current and voltage at a pulse duty ratio proportional to the other of the load current and voltage. A hysteresis comparator forces the direction of integration to alternate between positive and negative limits for balancing out offset voltages in the integrator and comparator. A triangular-wave generator employed as part of the pulse-width-modulation technique is also implemented using a switched-capacitor integrator. The switched-capacitor integrators permit fabrication of the circuit with the required accuracy without needing external, discrete time-constant-determining resistances and capacitances. Measurement accuracy is determined by the ratio of capacitances of two on-chip capacitors, the accuracy to a clock signal and two reference voltages. These parameters are closely controllable on a single MOS or CMOS chip using normal process control whereby the entire electronic watthour measurement device may be realized on a single chip without requiring off-chip components.

3 Claims, 6 Drawing Sheets

FIG. 3
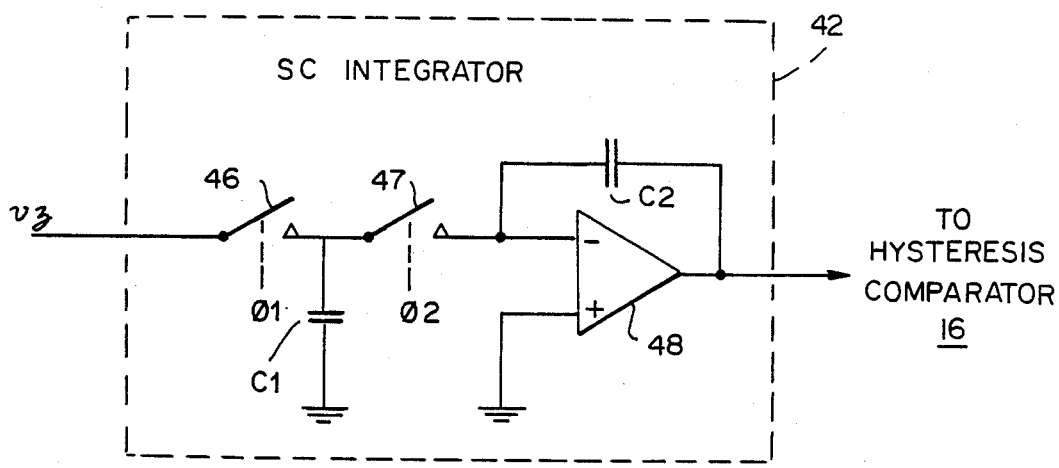
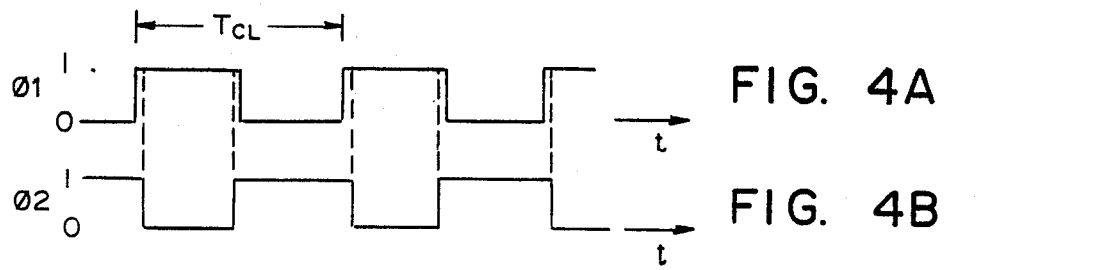
FIG. 4A
FIG. 4B
FIG. 5
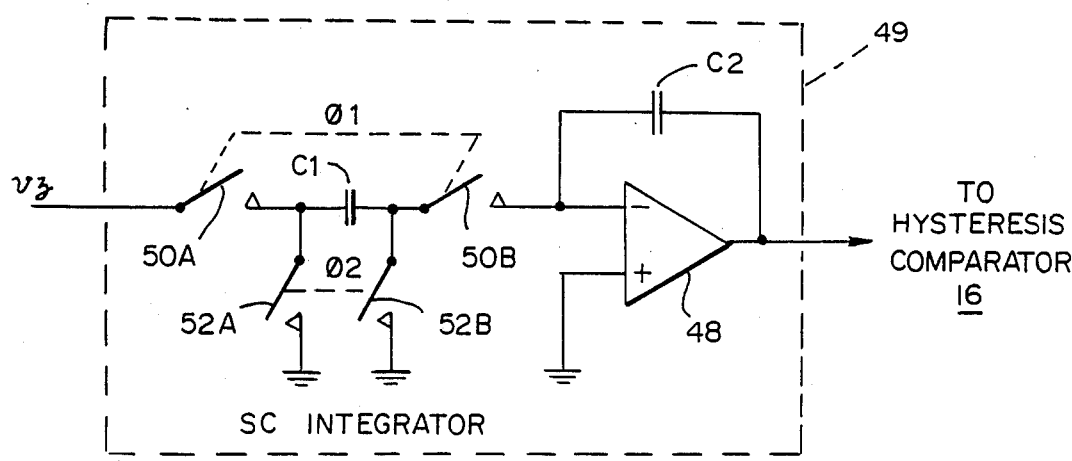

SOLID STATE WATTHOUR METER WITH SWITCHED-CAPACITOR INTEGRATION

This is a divisional of co-pending application Ser. No. 862,369, filed on Dec. 23, 1985.

BACKGROUND OF THE INVENTION

The present invention relates to measurement devices and, more particularly, to electronic devices for measuring the consumption of electricity by a load.

In my prior U.S. Pat. Nos. 3,875,508; 3,875,509; and 4,682,102 I disclose power consumption measurement techniques in which an analog signal representative of one of load current and voltage is pulse-width modulated by a signal representative of the other of load current and voltage. The resulting pulse-width-modulated signal is the product of instantaneous voltage and current. The product signal contains an oscillating component, which is filtered therefrom, and a desired average component which is integrated for application to succeeding circuits.

Concerns for reliability, low power consumption and low-cost manufacturing make desirable the use of integrated circuits to perform as many metering functions as possible. External devices required by the metering devices of my prior disclosures such as, for example, relays, resistors, capacitors and inductors, prevent substantially full integration thereof on a silicon integrated circuit. Current CMOS (complementary metal oxide semiconductor) technology is capable of providing switching and amplifying functions on a single silicon chip without the need for external components.

The integrating function employed to separate the average component from the oscillating component of the product signal conventionally requires resistors and capacitors of high accuracy. Available CMOS techniques are incapable of producing resistors and capacitors on the silicon chip having values well enough controlled to attain required measurement accuracies. For example, on-chip resistors exhibit poor temperature stability. As a consequence, a CMOS electronic metering device requires external resistors and/or capacitors. This increases manufacturing cost and reduces product reliability. Component tolerances of the external components may require final adjustment during manufacture to attain the desired measurement accuracy. In addition, the ability of such CMOS electronic metering devices with external components to maintain calibration accuracy throughout the wide temperature range to which conventional watthour meters are subjected, is degraded.

One type of integrating device, disclosed in the following papers, includes a switched-capacitor integrator especially adapted for realization in a metal-oxide semiconductor integrated circuit: "Potential of MOS Technologies for Analog Integrated Circuits"; David Hodges, Paul Gray and Robert Broderson; IEEE Journal Solid-State Circuits, June 1987, pages 285-294. "MOS Sampled Data Recursive Filters Using Switched Capacitor Integrators"; Bedrick Hostika, Paul Gray and Robert Broderson; IEEE Journal Solid-State Circuits, June 1987, pages 600-608. "Effect of Switch and Routing Related Parasitic Capacitances"; Modern Filter Design, pages 458-461, Prentice Hall.

The above papers disclose filters, integrators, and analog-to-digital converters, integrated on a single chip using a switched capacitor to replace the input resistor of an integrator. The time constant of the switched-capacitor integrator is equal to the ratio of the integrating capacitor divided by the clock frequency. Since a given ratio of two capacitors formed on the same silicon chip is easy to attain, and since the temperature coefficients of such capacitors tend to track each other very closely, many of the drawbacks of the prior-art integrators are overcome.

A further problem in prior-art electronic watthour metering devices is caused by offset voltages in amplifiers and threshold devices used therein. In my referenced patents and patent application, I disclose a technique for integrating alternately upward and downward between positive and negative threshold voltages. Any existing offset voltage adds to the signal during one direction of integration and subtracts therefrom during integration in the other direction. This cancels the effect of the offset voltage The following papers disclose techniques for periodically storing an image of the offset voltage and for applying the image to cancel the effect thereof: "Offset-Compensated Switched-Capacitor Leapfrog Filters"; S. Eriksson, K. Chen; Electronic Letters, pages 731-733; August, 1984. "Techniques for Offset Voltage Cancellation in MOS Operational Amplifiers"; S. Wong, C. Salama; Electronic Letters, pages 389-390; April, 1985.

None of the foregoing references addresses the problem of an integrated electronic watthour metering device.

OBJECTS AND SUMMARY OF THE INVENTION

Accordingly, it is an object of the invention to provide an electronic watthour metering device which overcomes the drawbacks of the prior art.

It is a further object of the invention to provide an electronic watthour metering device on a single chip without requiring external circuits for controlling an integrating time constant.

It is a still further object of the invention to provide an electronic watthour metering device in which the measurement accuracy is related to a capacitance ratio of two on-chip capacitors, the magnitude of a reference voltage and the accuracy of a clock signal.

Briefly stated, the present invention provides a switched-capacitor integrator in an electronic watthour measurement device which integrates the average component of a product signal formed by pulse-width modulating an analog signal proportional to one of a load current and voltage at a pulse duty ratio proportional to the other of the load current and voltage. A hysteresis comparator forces the direction of integration to alternate between positive and negative limits for balancing out offset voltages in the integrator and comparator. A triangular-wave generator employed as part of the pulse-width-modulation technique is also implemented using a switched-capacitor integrator. The switched-capacitor integrators permit fabrication of the circuit with the required accuracy without needing external, discrete time-constant-determining resistances and capacitances. Measurement accuracy is determined by the ratio of capacitances of two on-chip capacitors, the accuracy to a clock signal and to two reference voltages. These parameters are closely controllable on a single MOS or CMOS chip using normal process control whereby the entire electronic watthour measurement device may be realized on a single chip without requiring off-chip components.

According to an embodiment of the invention, there is provided an electronic watthour metering apparatus comprising: means for producing a product signal responsive to an analog voltage related to one of a load voltage and a current pulse-width modulated in relation to the other of the load voltage and current, means for integrating the product signal, a hysteresis comparator responsive to an integrated output of the means for integrating and effective for changing its output between first and second different voltages upon the integrated output attaining third and fourth different values, the means for producing a product signal including means responsive to the first voltage for driving the means for integrating in a first direction and responsive to the second voltage for driving the means for integrating in a second direction whereby an offset voltage is cancelled, and the means for integrating including a switched-capacitor integrator.

According to a feature of the invention, there is provided an electronic watthour metering apparatus comprising: first, second and third processors, the first, second and third processors each including means for producing a product signal responsive to an analog voltage related to one of a load voltage and a current pulse-width of a phase of a three-phase power modulated in relation to the other of the load voltage and current, the first, second and third processors including means for integrating the product signal, a hysteresis comparator responsive to an integrated output of the means for integrating from each of the first, second and third processors and effective for changing its output between first and second different voltages upon the integrated output attaining third and fourth different values, the means for producing a product signal in the first, second and third processors including means responsive to the first voltage for driving the means for integrating in a first direction and responsive to the second voltage for driving the means for integrating in a second direction whereby an offset voltage is cancelled, and the means for integrating including a switched-capacitor integrator.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 3 is a schematic diagram of a switched-capacitor integrator to which reference will be made in describing the operation thereof.

FIGS. 4A and 4B are waveforms employed to control the switching of the switched-capacitor integrator of FIG. 3.

FIG. 5 is a schematic diagram of a switched-capacitor integrator suitable for use in an electronic watthour metering device.

DETAILED DESCRIPTION OF THE PREFERRED EMBODIMENT

Figure 1:
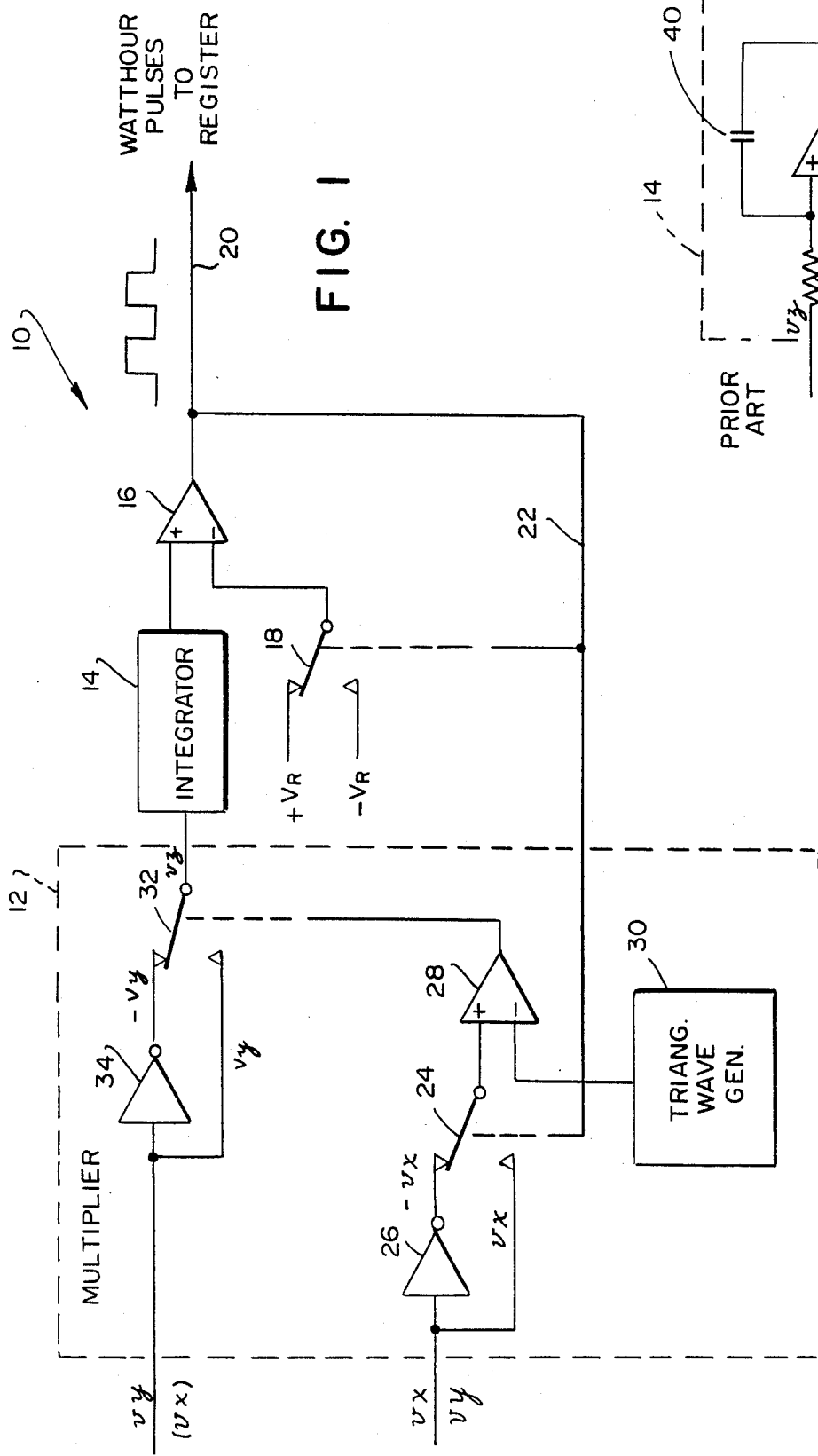
FIG. 1 is a simplified block diagram of an electronic watthour measurement device to which reference will be made in describing both the prior art and the present invention.

Referring to FIG. 1, there is shown, generally at 10, an electronic watthour metering circuit of a type disclosed in my referenced prior patents and application. A multiplier 12 pulse-width modulates a current analog signal voltage vy at a duty ratio determined by a potential analog signal voltage vx to produce a product signal vz containing an oscillating component and an average component. Equivalently, the current and potential signal voltages vy and vx may be interchanged without affecting the operation of multiplier 12. An integrator 14 integrates between substantially equal reference levels $+VR$ and $-VR$, first in one direction, and then reversing to integrate in the other direction.

The output of integrator 14 is applied to an input of a hysteresis comparator 16 whose second input receives one of reference voltages $+VR$ and $-VR$ under control of a switch 18. The output of hysteresis comparator 16 is a pulse signal alternating between two predetermined discrete levels which are preferably substantially equal to the two reference voltages fed to its input. Each cycle of the output signal, indicating the consumption of a predetermined quantum of electricity such as, for example, one watthour, is fed on an output line 20 to a conventional register or other using device (not shown). The output signal is also fed back on a line 22 to control the position of switch 18 and a switch 24 in multiplier 12. Thus, when the output of integrator 14 attains a value equal to one of the reference voltages fed to hysteresis comparator 16, the output of hysteresis comparator 16 forces switch 18 to apply the other reference voltage to the input of hysteresis comparator 16. In addition, the operation of switch 24 reverses the direction of integration in integrator 14.

The potential analog signal vx is applied directly to one terminal of switch 24 and, through an inverter 26, to the other terminal of switch 24. Switch 24 applies the non-inverted or the inverted potential analog signal vx or $-vx$ to an input of a threshold circuit 28. The other input of threshold circuit 28 receives a triangular-wave signal from a triangular wave generator 30. The output of threshold circuit 28 controls a multiplier switch 32 at a duty ratio which depends on the amplitude of the potential analog signal vx. The current analog signal vy is applied directly to one terminal of multiplier switch 32 and through an inverter 34 to the other input of multiplier switch 32. As fully detailed in my referenced patents and patent application, during one condition of switch 24, the product signal vz from multiplier switch 32 forces integrator 14 to integrate in one direction, and, during its other condition, forces integrator 14 to integrate in the opposite direction. The integration rate, and the consequent frequency of the output signal on output line 20, depends upon the amplitudes of the potential and current analog signals vx and vy. Although represented as mechanical switches, switches 16, 24 and 32 are preferably electronic devices formed during the production of the integrated circuit of electronic watt-hour metering circuit 10, as will be explained.

Figure 2:
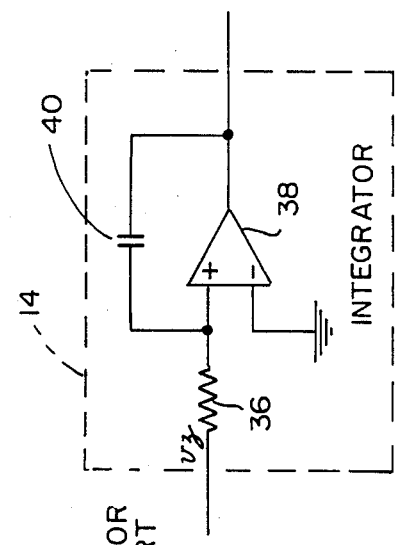
FIG. 2 is a schematic diagram of an integrator circuit according to the prior art.

Referring now to FIG. 2, a prior-art embodiment of integrator 14 is shown in which an input resistor 36 applies a current proportional to the product pulse-width-modulated signal vz to an input of an operational amplifier 38. A second input of operational amplifier 38 is grounded. An integrating capacitor 40 is connected from the output of operational amplifier 38 back to its input. As is well known, the high gain of operational amplifier 38 drives its output voltage to a value which, when fed back to its input through integrating capacitor 40, maintains its input at virtual ground.

The measurement accuracy of integrator 14 is related to the tolerances of input resistor 36 and integrating capacitor 40 as well as the reference voltages +VR and −VR (FIG. 1). It is possible to control the reference voltages with an on-chip voltage regulator. Thus, the critical components for measurement accuracy are input resistor 36 and integrating capacitor 40. Inaccuracies on the order of 20 percent are likely for these components formed on a silicon CMOS chip. Such inaccuracies are unacceptable in watthour metering where accuracies on the order of 0.1 percent are desired. Even when input resistor 36 and integrating capacitor 40 are implemented in precision external components, accuracies as good as 0.2 percent are extremely difficult and expensive to attain. Even if the desired accuracy is attained at one temperature, temperature-related component drift in external components is unlikely to track those of on-chip components. As a consequence, its measurement accuracy tends to degrade over at least parts of the operating temperature range. Thus, a prior-art integrator 14 fails to offer a convenient, accurate, and economical approach to integration of an electronic watthour meter.

Referring now to FIG. 3, a switched-capacitor integrator 42 is shown in which the function of input resistor 36 in prior-art integrator 14 is replaced by an input capacitor C1 and a pair of alternately operated switches 46 and 47 controlling the application of a current proportional to product voltage vz to an input of an operational amplifier 48. An integrating capacitor C2 is connected from the output of operational amplifier 48 to its input.

In operation, switches 46 and 47 are alternately controlled by non-overlapping control signals such as, for example, shown in FIGS. 4A and 4B. Initially, switch 47 is open and switch 46 is closed. Input capacitor C1 stores a quantity of charge Q as follows:

$$Q = C1 \, vz$$

Switch 46 is then opened and switch 47 is closed. The charge Q is injected into the input of operational amplifier 48. The output voltage of operational amplifier 48 rises to a value which, applied through integrating capacitor C2, maintains its input at virtual ground.

If switches 46 and 47 are operated at a switching frequency Fc1, each cycle of operation stores and transfers a charge Q and the resulting current iz is:

$$iz = (C1 \, vz) / Fc1$$

Since the input of operational amplifier 48 must remain at virtual ground, the current ifb through integrating capacitor C2 must also be equal to iz. The equivalent time constant of switched-capacitor integrator 42 is:

$$TC = (1/Fc1)(C2/C1)$$

It is important to note that the time constant TC is controlled by the ratio of capacitances and the switching frequency Fc1. Such capacitor ratio can be achieved to a fraction of one percent, although the absolute values of the capacitances may depart significantly from target values. I have discovered means for controlling the switching frequency to a small fraction of one percent, corresponding to the capacitance ratio. Although represented as mechanical switches, switches 46 and 47 are, in fact, solid-state switches formed in the same process creating the remainder of switched-capacitor integrator 42.

The embodiment of switched-capacitor integrator 42 in FIG. 3 is subject to inaccuracies due to the influence of noise. This problem is cured in a switched-capacitor integrator 49 illustrated in FIG. 5, to wiich reference is now made. A first switch 50A connects the product voltage vz to one terminal of input capacitor C1. A second switch 50B connects the second terminal of input capacitor C1 to the input of operational amplifier 48. Switches 52A and 52B connect the terminals of input capacitor C1 to ground.

In operation, switches 50A and 50B are simultaneously operated by the phase-1 signal of FIG. 4A and switches 52A and 52B are simultaneously operated by the phase-2 signal of FIG. 4B. Beginning with switches 52A and 52B closed, input capacitor C1 is fully discharged. Switches 52A and 52B are then opened, and a short time later switches 50A and 50B are closed. During the closed period of switches 50A and 50B, the charge Q=C1 vz enters input capacitor C1 through switch 50A and a corresponding charge −Q enters input capacitor C1 through switch 50B. Thus, the circuit of FIG. 5 is the functional equivalent of the circuit of FIG. 3. However, whenever input capacitor C1 is connected to the input of operational amplifier 48, it is also connected to the source of product signal vz which is, in turn, returned to ground. Thus switched-capacitor integrator 49 is rendered immune from noise.

Figure 6:
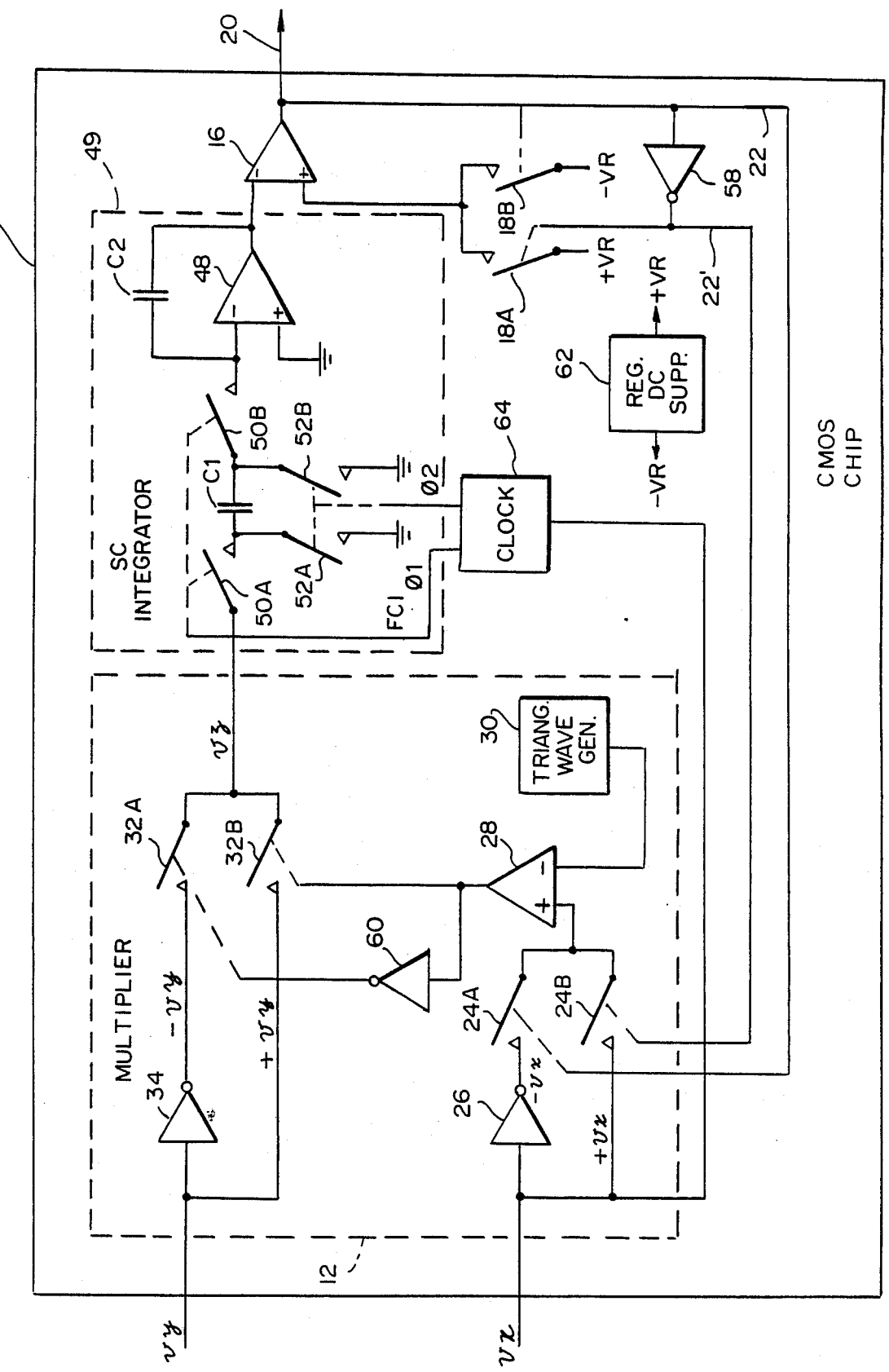
FIG. 6 is a schematic diagram of a CMOS chip integrated circuit for an electronic watthour meter according to an embodiment of the invention.

Referring now to FIG. 6, a single integrated CMOS chip 54 is shown outlined in dashed line containing all of the elements required to realize an electronic watthour metering circuit functionally corresponding to that shown in FIG. 1.

The single-pole double-throw switches 18, 24 and 32 of FIG. 1 are implemented in CMOS chip 54 of FIG. 6 using on-chip pairs of complementary solid-state switches having corresponding numbers with suffixes A and B. Complementary drive signals for the switches are produced by inverters. For example, switch 18B is directly driven by the signal on line 22, whereas switch 18B is driven by a cmplementary signal on a line 22′ from an inverter 58. The signals on lines 22 and 22′ are also applied to actuate switches 24A and 24B, respectively. The pulse-width-modulated signal from threshold circuit 28 is applied directly to multiplier switch 32B and is inverted in an inverter 60 before being applied to multiplier switch 32A.

As previously noted, the accuracy of switched-capacitor integrator 49 is determined by the capacitance ratio of capacitors C1 and C2, the switching frequency Fc1, and the regulation of the two reference voltages +VR and −VR. The ratio of capacitances is readily controlled to small tolerances and the temperature coefficients thereof tend to track each other. A conventional on-chip regulated DC reference power supply 62 is capable of voltage regulation on the order of a small fraction of one percent. Since regulated DC reference power supply 62 is conventional, it will not be further detailed.

CMOS chip 54 does not require external components and does not suffer a substantial degradation in accuracy resulting from a change in absolute value of components which control the integration time constants. Every circuit in CMOS chip 54 is implemented on the chip. The final accuracy-determining component, a clock 64, is described below.

Figure 7:
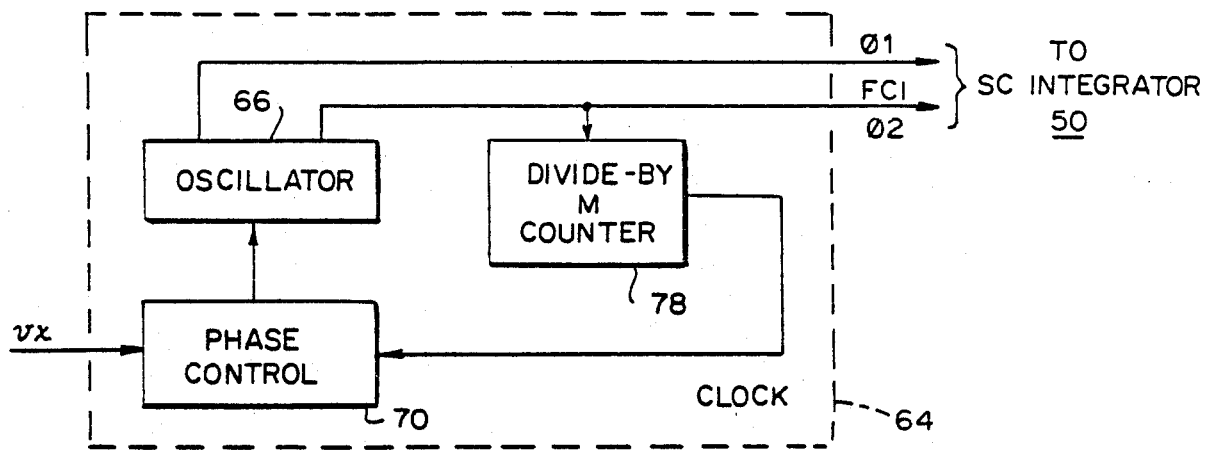
FIG. 7 is a block diagram of a clock for use in the electronic watthour meter of FIG. 6.

Referring now to FIG. 7, clock 64 includes an oscillator 66 in a phase-locked loop whose other components include a divide-by-M counter 68 and a phase control circuit 70. The potential analog signal vx is applied to phase control circuit 70. Oscillator 66 operates at a frequency M times the line frequency represented by the potential analog signal vx. Divide-by-M counter 68 divides the clock signal Fc1 by a factor M, whereby the divided signal has a frequency equal to the line frequency. Phase control circuit 70 compares the phases of the two signals it receives and applies a control signal to oscillator 66 effective to lock the frequency of the clock signal Fc1 to the desired multiple of the line frequency. Thus, the frequency accuracy of the clock signal Fc1 is equal to the frequency accuracy of the line frequency. Line-frequency accuracies on the order of a small fraction of one percent are encountered in typical power systems. The phase 1 and phase 2 output clock signals Fc1 from oscillator 66, have the non-overlapping time relationships shown in FIGS. 4A and 4B.

The frequency of clock signal Fc1 is preferably high with respect to the line frequency. In the preferred embodiment a multiplier M of about 1000 is employed in divide-by-M counter 68 to yield a clock signal frequency of about 60 KHz.

Referring again to FIG. 6, triangular wave generator 30 produces a triangular wave varying linearly between equal positive and negative magnitudes. The frequency of the triangular wave is not critical, but in the preferred embodiment a frequency of about 6 KHz is employed. Since its frequency is not critical, any convenient technique may be employed for its implementation. However, a switched-capacitor technique is employed in the preferred embodiment for the same reasons that switched-capacitor techniques are desirable in switched-capacitor integrator 49.

Figure 8:
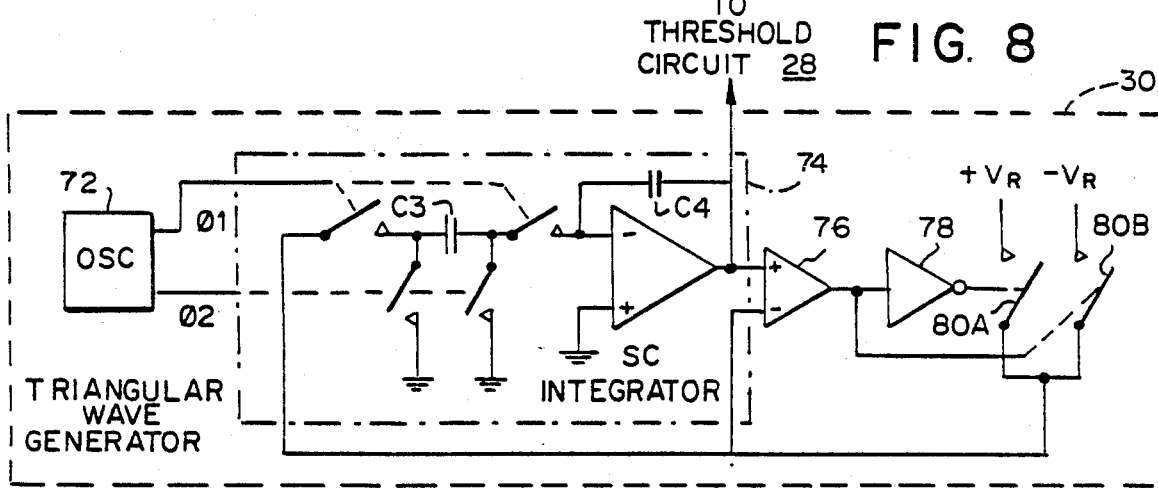
FIG. 8 is a schematic diagram of a triangular wave generator of FIG. 6.

Referring now to FIG. 8, triangular wave generator 30 includes a free running oscillator feeding non-overlapping control signals to switches in a switched-capacitor integrator 74 whose structure and function is identical to switched-capacitor integrator 49 in FIGS. 5 and 6. Additional description of switched-capacitor integrator 74 is therefore omitted. A hysteresis comparator 76, an inverter 78 and a pair of switches 80A and 80B, controlled by the direct and inverted output of hysteresis comparator 76, reverse the direction of integration each time the output of switched-capacitor integrator 74 reaches the predetermined positive and negative reference voltages +VR and −VR. The capacitance ratio of capacitors C3 and C4 in switched-capacitor integrator 74, and the switching frequency produced by free running oscillator are preferably selected in relation to the values of reference voltages +VR and −VR to produce a triangular wave from triangular wave generator 30 having a frequency of about 6 KHz. The triangular-wave frequency is not critical and does not affect the accuracy of the device, provided that it contains many triangular-wave cycles per cycle of the line frequency.

Referring again to FIG. 6, it is apparent that each of the parameters governing the accuracy of switched-capacitor integrator 49 and the pulse output frequency of hysteresis comparator 16 is controllable to small values using conventional processing to produce CMOS chip 54. Careful process control during the manufacture of CMOS chip 54 may make it possible to attain the desired accuracy without requiring adjustment.

The frequency-control technique in the foregoing embodiment employing the line frequency for controlling the switching frequency of switched-capacitor integrator 49 is elegant in its simplicity and accomplishes all functions without requiring off-chip components. Certain applications such as, for example, those involving unsatisfactory regulation of the line frequency, may make desirable the alternate approach illustrated in FIG. 9.

A CMOS chip 82 includes a clock 84 which, instead of being phase-locked to the line frequency, obtains its frequency control from an external crystal 86. Crystal 86 controls the frequency of an oscillator 88 whose frequency is divided in a divider logic circuit 90 to derive the desired switching signals for application to switched-capacitor integrator 49.

Divider logic circuit 90 may optionally contain additional divider circuits for producing a timing signal applied on a line 92 to multiplier 12 wherein it may replace phase control circuit 70 (FIG. 8) of triangular wave generator 30.

In addition to the cancellation of offset voltage attained by alternate up and down integration as employed in the foregoing disclosure, additional offset voltage cancellation may be obtained by storing samples of the offset voltage, and employing the stored samples to cancel any effect of offset voltage during operation. For example, such a technique, disclosed in the referenced Eriksson and Chen paper, may be used without departing from the spirit and scope of the present invention.

Figure 10:
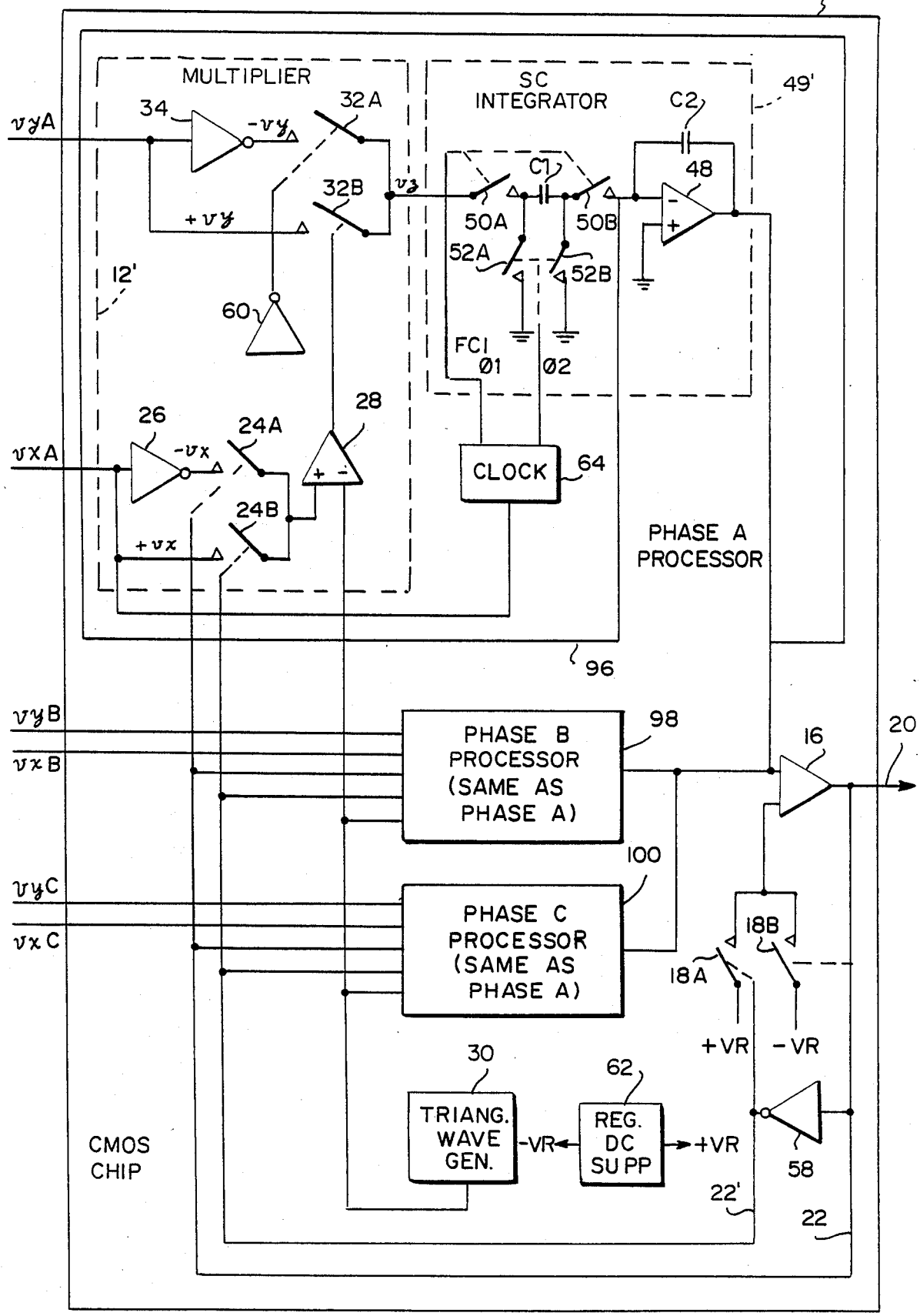
FIG. 10 is a schematic diagram of a three-phase electronic watthour meter adapted for integration on a single chip.

Referring now to FIG. 10, a three-phase electronic watthour metering circuit, shown generally at 94, measures the power consumption in a three-phase system using a phase A processor 96 for measuring the power consumption in phase A, a phase B processor 98 for measuring the power consumption in phase B, and a phase C processor 100 for measuring the power consumption in phase C. It will be noted that phase A, B and C processors 96, 98 and 100 are identical to the single processor on CMOS chip 54 of FIG. 6 except that the functions of triangular wave generator 30 and hysteresis comparator 16 with its associated switches 18A and 18B and inverter 58 are shared by the three processors. This reduces the real estate required for implementing the combined circuit.

Since three-phase electronic watthour metering circuit 94 comprises three processors which function identically to CMOS chip 54 in FIG. 6, further description thereof appears to be redundant and is therefore omitted.

One skilled in the art would recognize that a single clock 64 could be shared by the three processors. It is considered useful to include separate circuits for clock 64 in each of the processors to ensure that failure of a phase providing the reference for clock 64 does not destroy the measurement capability of the system.

Figure 9:
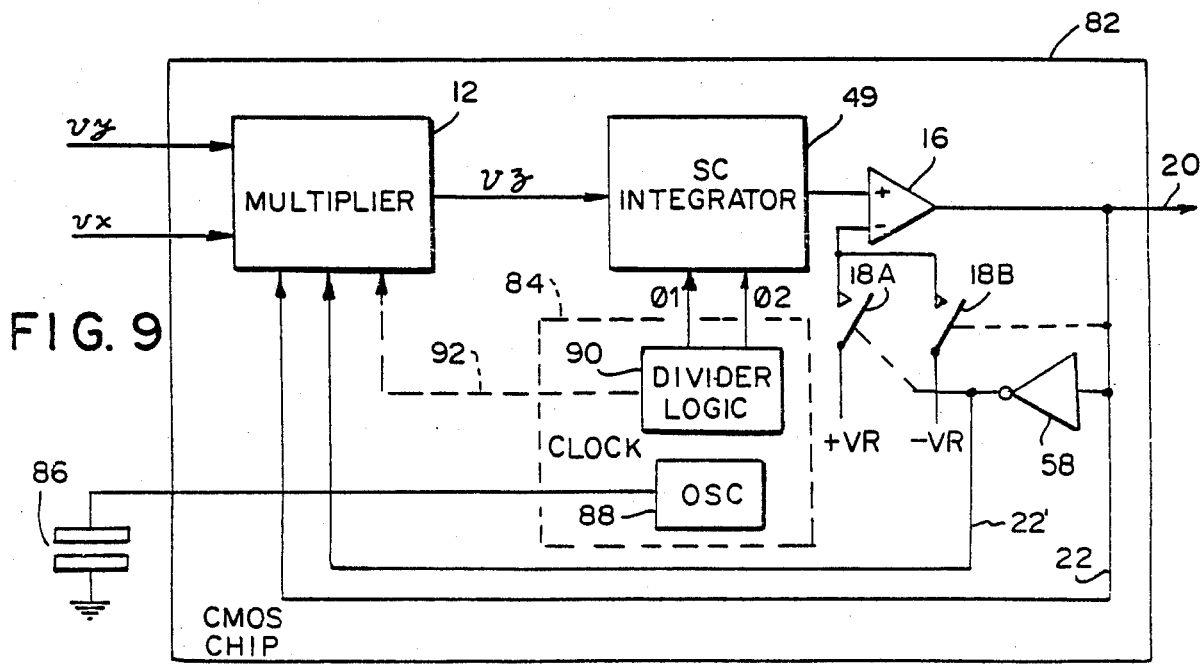
FIG. 9 is a simplified block diagram of an electronic watthour meter employing a crystal-controlled clock.

A three-phase embodiment of an electronic watthour metering circuit may be used employing a crystal-controlled clock corresponding to the single-phase version in FIG. 9. Such a device is considered to be fully disclosed by the combination of FIGS. 9 and 10 and need not be further illustrated or described to enable one skilled in the art to make and use this embodiment.

The foregoing embodiments of the invention provide integration of a product signal for slightly less than 50 percent of the time with intervening periods dring which no integration takes place. In some applications, the charge in integrating capacitor may at least partly dissipate during the non-charging time. The embodiment of the invention shown in FIG. 11 overcomes this problem.

Figure 11:
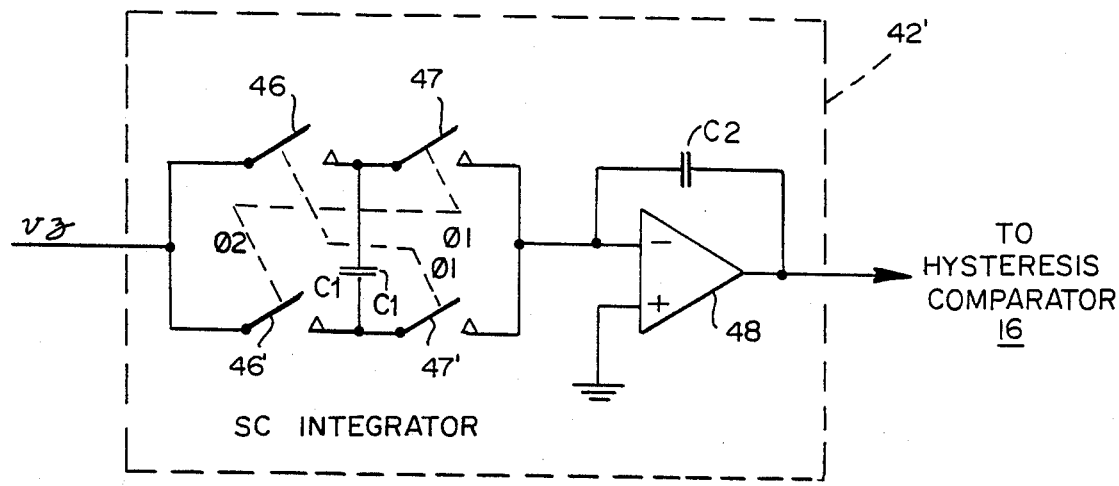
FIG. 11 is a schematic diagram of a switched-capacitor integrator providing for nearly continuous charging of its integrator.

Referring now to FIG. 11, a switched-capacitor integrator 42' is shown which is very similar to the embodiment shown in FIG. 3 except for the addition of an additional pair of switches 46' and 47' which are driven by switching signals of opposite phasing to their counterparts 46 and 47. Except during the small non-overlap time of the switching signals in FIGS. 4A and 4B during which all switches are open, integrating capacitor receives charge at all times.

The embodiment of the invention in FIG. 11, like its counterpart in FIG. 3 is noise sensitive.

Figure 12:
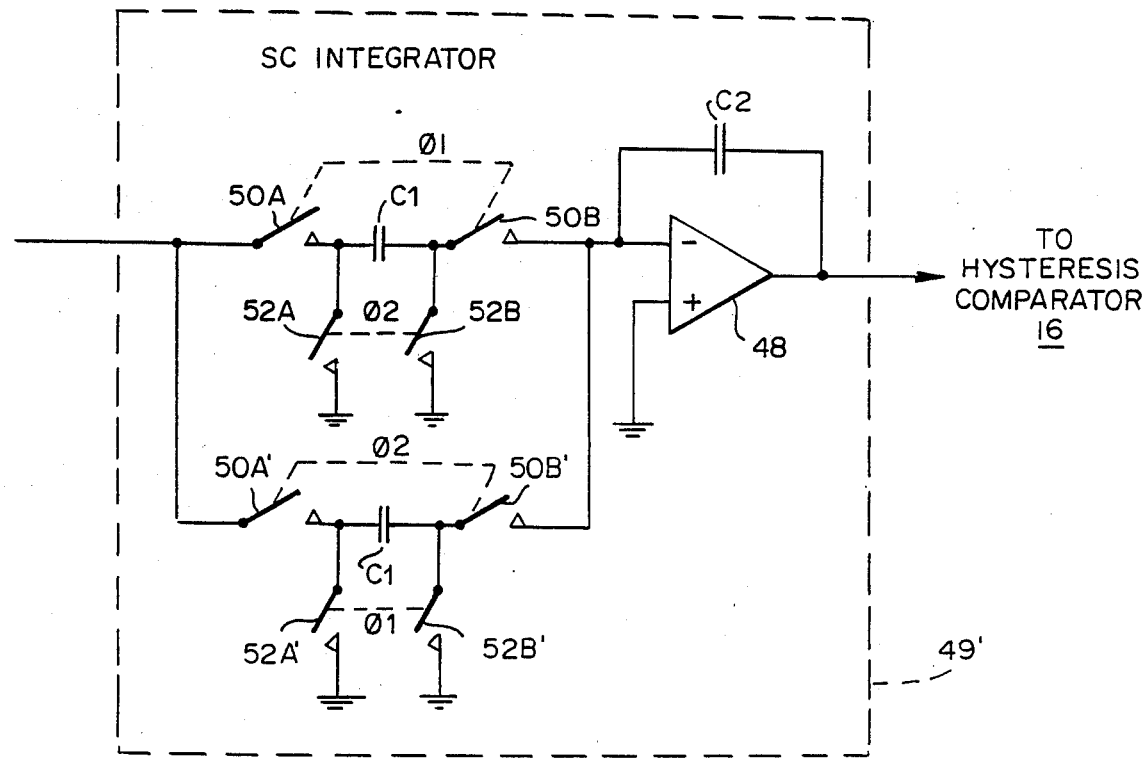
FIG. 12 is a schematic diagrmm of a further embodiment of a switched-capacitor integrator providing nearly continuous charging of its integrator.

Referring now to FIG. 12, an embodiment of the invention is shown which is similar to that of FIG. 5 except for the addition of two additional pairs of switches 50A', 50B', 52A', and 52B' and a second switched capacitor C1' all in parallel with their unprimed counterparts. The primed and unprimed counterpart switches ar driven by oppositely-phased switching signals whereby constant charging of integrating capacitor C2 is obtained except for the relatively short non-overlap times of the switching signals in FIGS. 4A and 4B.

The embodiment of the invention in FIG. 12 is noise insensitive.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A solid state watthour meter comprising:

means for producting a product signal responsive to an analog voltage related to one of a load voltage and a current, said product signal being pulse-width modulated in relation to the other of said load voltage and current;

a first capacitor;

means for charging said first capacitor to said analog voltage whereby said first capacitor contains a charge related to an instantaneous value of said analog voltage;

means for disconnecting said first capacitor from said analog voltage whereby said charge remains in said first capacitor;

a second capacitor means for adding said charge to said second capacitor;

means for cycling through said means for charging, means for disconnecting and means for adding at a predetermined fixed frequency which is high with respect to a frequency of said pulse-width modulated product signal, whereby a rate of increase of charge in said second capacitor is proportional to a ratio of capacitances of said second and first capacitors and said predetermined fixed frequency;

a hysteresis comparator responsive to a charge in said second capacitor and effective for changing its output between first and second different voltages upon said charge in said second capacitor attaining first and second different values, respectively; and said means for producing a product signal including means responsive to said first voltage for producing a product signal producing integration in a first direction and responsive to said second voltage for producing integration in a second direction.

2. A solid state watthour meter according to claim 1, wherein said means for charging includes:

a first switch connectable between said analog voltage and a first terminal of said capacitor;

a second switch connectable between a second terminal of said capacitor and a reference voltage; and means for closing said first and second switches for said charging and for opening said first and second switches for said disconnecting.

3. A solid state watthour meter according claim 2, wherein said means for adding includes:

a third switch connectable between said first terminal of said first capacitor and said reference voltage;

a fourth switch connectable between said second terminal of said first capacitor and said second capacitor; and means for closing said third and fourth switches for said adding and for opening said third and fourth switches for all other operations.

* * * * *